United States Patent [19]
Koga

[11] Patent Number: 5,936,897
[45] Date of Patent: Aug. 10, 1999

[54] SEMICONDUCTOR STORAGE DEVICE CAPABLE OF FAST WRITING OPERATION

[75] Inventor: Makoto Koga, Kawasaki, Japan

[73] Assignee: Fujitsu Limited, Kawasaki, Japan

[21] Appl. No.: 09/048,996

[22] Filed: Mar. 27, 1998

[30] Foreign Application Priority Data

Oct. 20, 1997 [JP] Japan ................................. 9-287225

[51] Int. Cl.⁶ .................................................. G11C 7/00
[52] U.S. Cl. ........................................ 365/190; 365/205
[58] Field of Search ..................................... 365/190, 205

[56] References Cited

U.S. PATENT DOCUMENTS

| | | | |
|---|---|---|---|
| 5,369,620 | 11/1994 | Sugibayashi | 365/230.03 |
| 5,742,544 | 4/1998 | Foss | 365/189.03 |
| 5,838,604 | 11/1998 | Tsuboi et al. | 365/63 |
| 5,862,095 | 1/1999 | Takahashi et al. | 365/222 |

*Primary Examiner*—David Nelms
*Assistant Examiner*—M. Tran
*Attorney, Agent, or Firm*—Nikaido, Marmelstein, Murray & Oram LLP

[57] ABSTRACT

The present invention relates to a memory device including a sense amplifier for driving bit line pair and write amplifier for driving data bus line connecting to the bit line pair. According to the present invention, when the column gates are opened and the sense amplifiers are connected to the data bus amplifiers via the data bus pair, one sense amplifier circuit portion of each sense amplifier is deactivated and the conflicts which arise from the operation of the write amplifiers in the data bus amplifiers and of the sense amplifiers can be avoided, and the writing operation can be performed at a high speed. In addition, the control of the sense amplifiers need not be changed either for the reading process or for the writing process, and the writing speed can be increased without the reading being affected.

8 Claims, 13 Drawing Sheets

FIG.2 EMBODIMENT

OPERATIONAL TIMING CHART

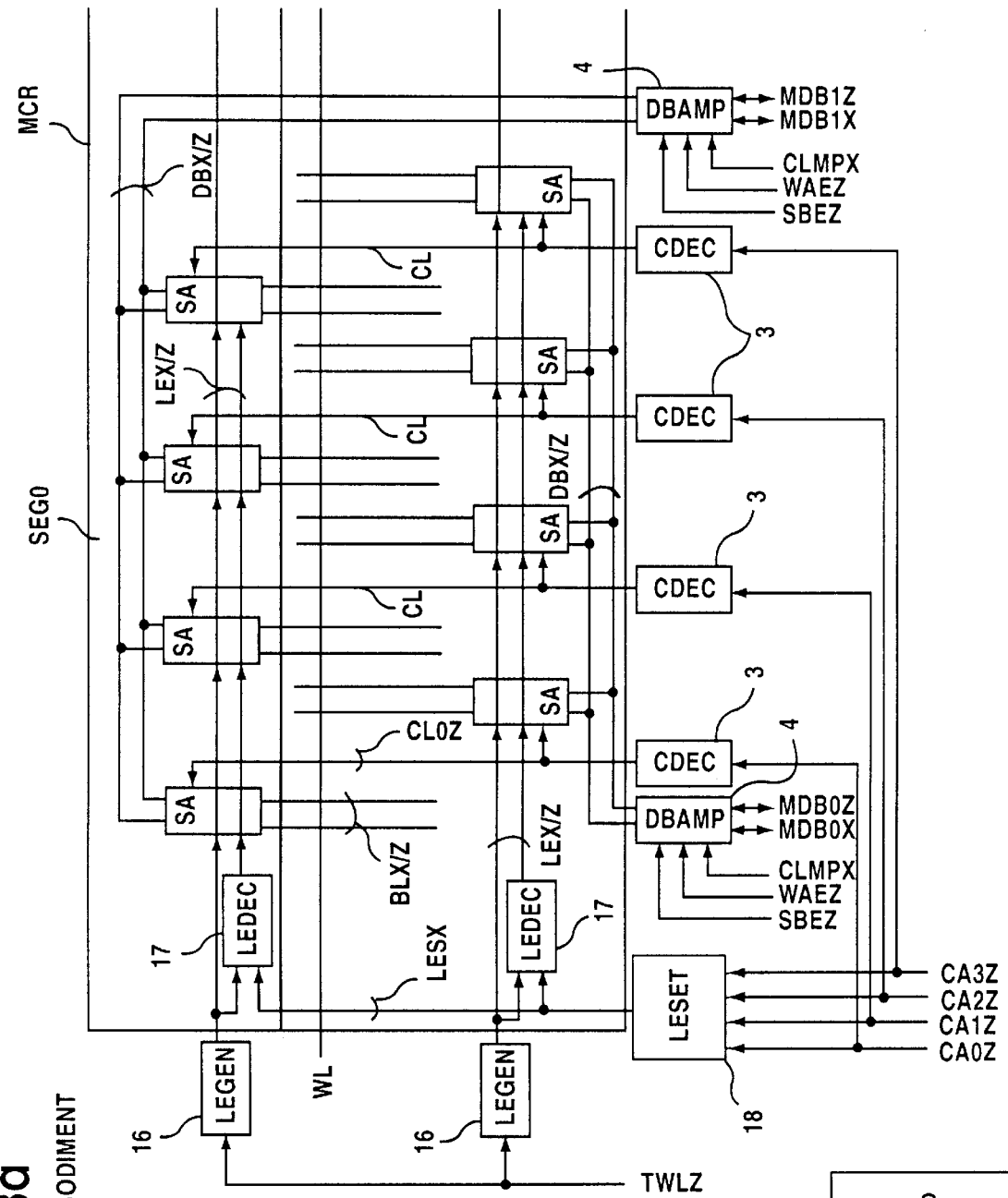
FIG.8a SECOND EMBODIMENT

SEMICONDUCTOR STORAGE DEVICE CAPABLE OF FAST WRITING OPERATION

BACKGROUND OF THE INVENTION

1. Field of the Invention

The present invention relates to a semiconductor storage device, such as DRAM, and in particular to a semiconductor storage device which exercises the same control for sense amplifiers for the reading and writing operations and which increases the speed of a writing operation.

2. Related Arts

The capacitance and the speed of dynamic random access memory have been increased, and as the increase in the capacitance of the memory has resulted in a concomitant increase in the size of memory cell arrays and also in the size of address decoders, a need exists for a simplified controller for controlling these circuits. In addition, with the increase in the memory speed there has been an attendant improvement in the reading and the writing speeds, and this has tended to lead to the fabrication of separate optimal controllers for each of these operations. The resolution of such a contradictory problem is required in order to satisfy the demands both for a larger capacitance for a semiconductor storage device, and for an improvement in its speed.

FIG. 1 is a partially schematic diagram illustrating a conventional semiconductor storage device. In a memory cell region MCR are provided a cell array 1, which includes a plurality of word lines WL and a plurality of bit line pairs BL intersecting the word lines WL, and a plurality of memory cells (not shown) located at their intersections; and arrays 5 and 6 of sense amplifiers SA, which are connected to the respective bit line pairs. A word line WL is selected and is driven by a word line driver, and the state of the memory cell connected to the selected word line is read to bit line pairs BL, while the potentials at the bit line pairs BL are detected and amplified by the sense amplifiers SA.

The bit line pairs BL are connected via column gates (not shown) to paired data buses DBX and DBZ, and to data bus amplifiers 4. The data bus amplifiers 4 each include a read amplifier for amplifying data read along the data bus DBX/Z and for outputting the resultant data to a main data bus MDBX/Z, and a write amplifier for driving the data bus DBX/Z in accordance with externally supplied write data.

Column gate selection signals CL0Z to CL3Z, which are used for selecting a column gate, are generated by column decoder drivers 3, which is supplied with column selection signals CA0Z to CA3Z obtained by decording column addresses. A timing signal TWLZ for activating the sense amplifiers is produced from a word line selection signal (not shown) which is activated when a predetermined period of time has elapsed following the driving of a selected word line. Upon the receipt of the timing signal TWLZ, a latch enable generator 2 generates latch enable signals (activation signals) LEX and LEZ for activating the sense amplifiers SA. In response to the generation of these latch enable signals, LEX and LEZ, the sense amplifiers SA in the upper and lower sense amplifier arrays 5 and 6 are activated.

When the thus structured semiconductor storage device is shifted from the standby state to the active state, first, row addresses are input and a word line WL is selected, and in response to the timing signal TWLZ that is activated following the elapse of a predetermined time, the sense amplifiers SA are activated. Then, column addresses are supplied, and in accordance with a read command or a write command, the data detected by the sense amplifiers SA are amplified by the data bus amplifiers 4 and read out, or in accordance with externally supplied write data, the write data is transmitted along the bit line pairs and written to memory cells by the data bus amplifiers 4. For a bit line pair which is not selected by the column gate selection signal CL, rewriting to the memory cells is performed at a potential amplified by the sense amplifier SA.

As is described above, during the reading operation, the sense amplifiers SA drive the data bus DB and transmit the data which have been read to the read amplifiers in the data bus amplifiers 4. During the writing operation, in order to invert and write the data stored in the memory cells, the write amplifiers in the data bus amplifiers 4 invert the states of the sense amplifiers SA and drive the potentials on the bit lines to a level corresponding to the data which are to be written. Therefore, the operation performed by the sense amplifier SA connected to a selected bit line pair causes a delay in the writing operation. In addition, a sense amplifier SA connected to an unselected bit line pair must again write the stored data to an unselected memory cell, and the operation of the sense amplifiers SA is necessary when the word line WL is driven.

As means for resolving the delay of the writing operation, it is proposed that the activation of a sense amplifier which is connected to a selected bit line pair be halted during the writing operation. According to this proposal, however, the operation of the sense amplifiers during a reading process must differ from their operation during a writing process. Therefore, a circuit for the generation of operation control signals must be additionally provided and control signals for the activation of individual sense amplifiers must be generated separately. And in addition, the control provided for the sense amplifiers SA of a selected column and for an unselected column must differ.

SUMMARY OF THE INVENTION

To overcome the above shortcomings, it is one object of the present invention to provide a semiconductor storage device wherein sense amplifiers perform the same operation for a reading process and a writing process, and further writing speed can be increased.

It is another object of the present invention to provide a semiconductor storage device wherein sense amplifiers perform the same operation for a reading process as for a writing process, and the speed both for the reading and the writing is improved.

To achieve the above objects, according to the present invention, a semiconductor storage device comprising:

a plurality of bit line pairs;

a plurality of word lines intersecting said bit line pairs;

a plurality of memory cells arranged at intersections of said bit line pairs and said word lines;

sense amplifiers connected to said bit line pairs, each of which includes a first sense amplification circuit for driving one bit line of said bit line pairs to a first level, and a second sense amplification circuit for driving the other bit line to a second level higher than said first level;

column gates respectively provided for said bit line pairs;

a data bus line pair connected via said column gates to a selected bit line pair;

data bus amplifier connected to said data bus line pair, which includes a read amplifier for detecting a level of said data bus line pair and a write amplifier for driving said data bus line pair; and a sense amplifier controller for deactivating, at a timing when said column gates are opened, either said first or said second sense amplification circuit of said sense amplifier.

According to the present invention, when the column gates are opened and the sense amplifiers are connected to the data bus amplifiers via the data bus pair, one sense amplifier circuit portion of each sense amplifier is deactivated and the conflicts which arise from the operation of the write amplifiers in the data bus amplifiers and of the sense amplifiers can be avoided, and the writing operation can be performed at a high speed. In addition, the control of the sense amplifiers need not be changed either for the reading process or for the writing process, and the writing speed can be increased without the reading being affected.

According to the present invention, further provided is a clamping circuit, which is connected to the data bus line pair and which drives the data bus line pair to level H at a time other than during a period in which the column gates are open. The sense amplifier controller deactivates the second sense amplification circuit at a timing the column gate is opened.

In case where the above clamping circuit is provided, the reading operation is not affected, even if the second sense amplification circuit for driving one of the bit line pairs to level H is deactivated.

In addition, according to the present invention, provided is a clamping circuit, which is connected to the data bus line pair and which drives the data bus line pair to level L at a time other than during a period in which the column gates are open. The sense amplifier controller deactivates the first sense amplification circuit at a timing the column gate is opened.

In case where the above clamping circuit is provided, the reading operation is not affected, even if the first sense amplification circuit for driving one of the bit line pairs to level L is deactivated.

Furthermore, according to the present invention, the sense amplifier controller supplies, to the sense amplifiers, a first and a second activation signal for activating the first and the second sense amplification circuits, and drives either the first or the second activation signal to a deactivation level at a timing the column gate is opened. And in addition, a process for driving either the first or the second activation signal to a deactivation level is performed for each of segments which are so defined in a direction of the word lines that a predetermined number of sense amplifiers are included therein.

With the above arrangement, the load imposed on the first or the second activation signal line is reduced, and either activation signal can be brought rapidly to the deactivation level in synchronization with the timing the column gate is opened.

Moreover, when the memory cell region is divided into a plurality of blocks, the driving of the first or the second activation signal to the deactivation level is performed only for a selected block.

Since a column gate only of a selected block is opened and its sense amplifier is connected to the data bus line, only the sense amplifier in that block need be deactivated.

DETAILED DESCRIPTION OF THE PREFERRED EMBODIMENTS

The preferred embodiments of the present invention will now be described while referring to the accompanying drawings. The technical scope of the present invention, however, is not limited to these embodiments. And while the present invention can be applied not only for a DRAM but also for any memory circuit having sense amplifiers and data bus amplifiers, in the following embodiments, an explanation will be given to a DRAM as an example. In the following description, the active level for control signals having a reference symbol Z is level H, and the active level for control signals having a reference symbol X is level L. It should be noted that X and Z are employed to denote a pair for bit lines and for data buses.

Figure 1:
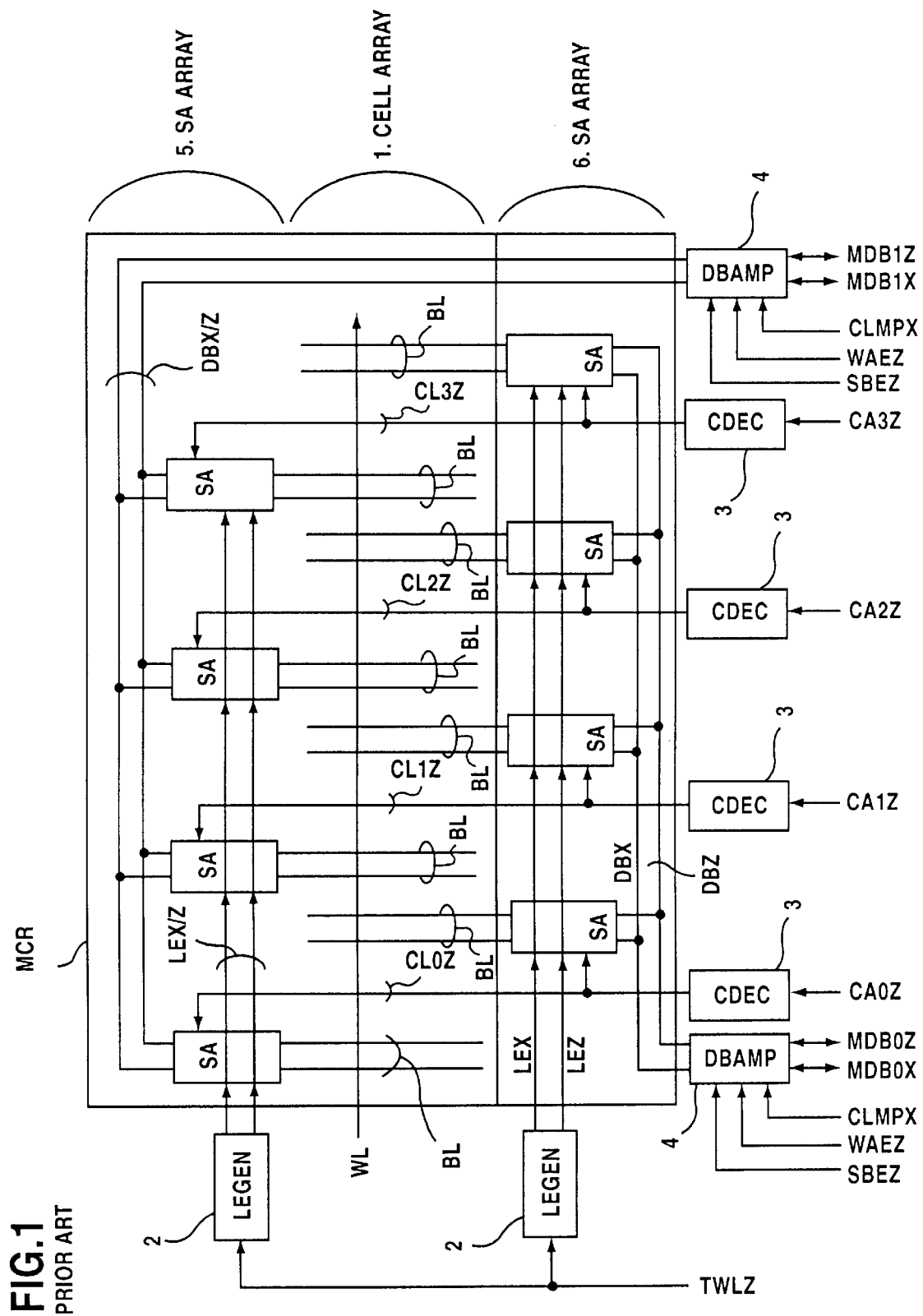
FIG. 1 is a partial schematic diagram illustrating a conventional semiconductor storage device.
Figure 2:
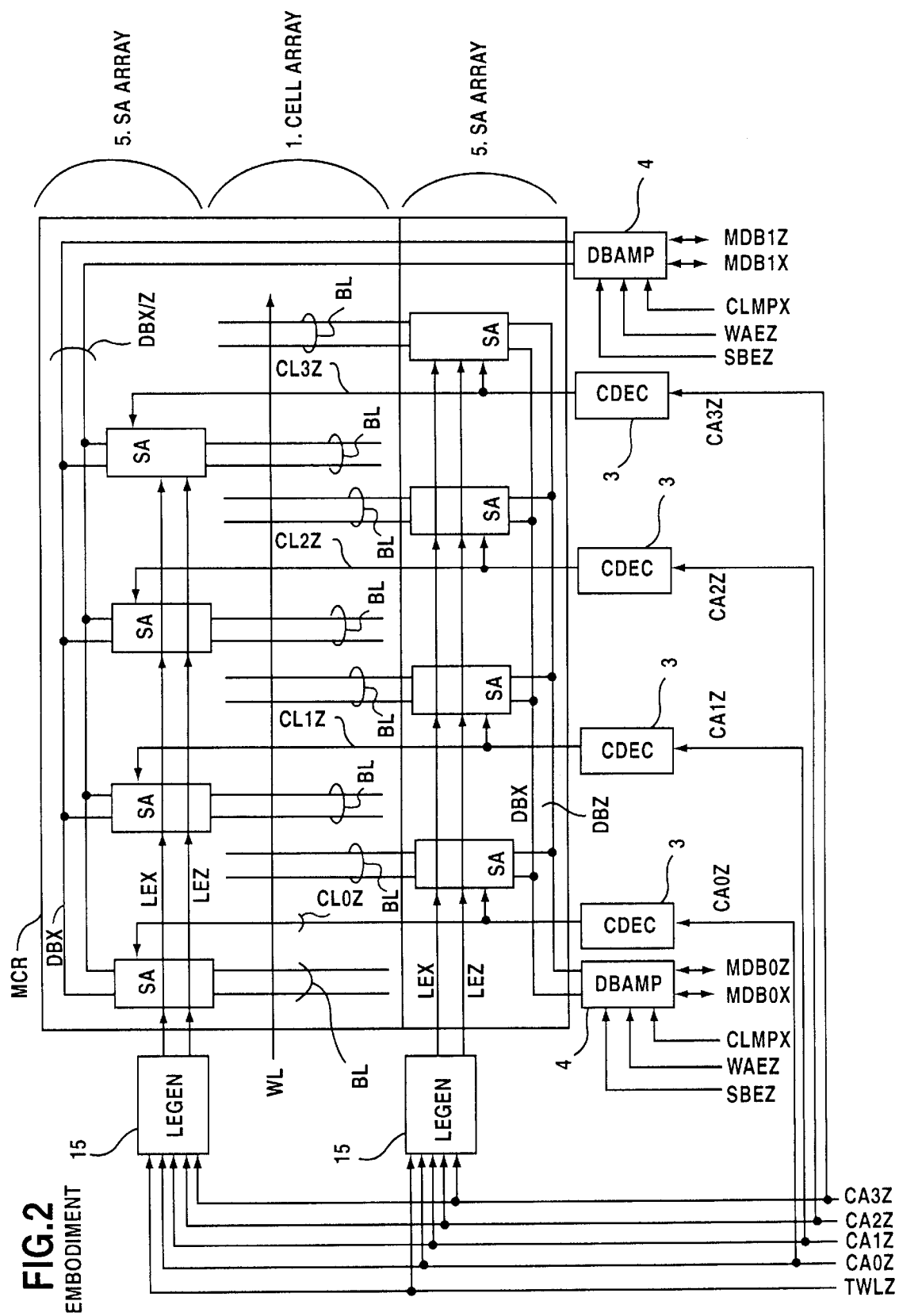
FIG. 2 is a diagram illustrating the general arrangement of a semiconductor storage device according to a first embodiment of the present invention.

FIG. 2 is a diagram illustrating the partial arrangement of a semiconductor storage device according to a first embodiment of the present invention. The same reference numerals as are used in FIG. 1 are also used to denote corresponding components. In this embodiment, which differs from the prior art in FIG. 1, not only a timing signal TWLZ, which is produced when a predetermined time has elapsed following driving of the word lines, but also column selection signals CA0Z to CA3Z, which are obtained by decoding column addresses, are supplied to a latch enable generator 15 for generating a latch enable signal LEX/Z for activating sense amplifiers. And, as is apparent from the description which will be given later, the latch enable generator 15 releases the activated state of either the latch enable signal LEX/Z, when one of the column selection signals CA0Z to CA3Z goes to level H (a selected state) and a corresponding column gate is opened. As a result, part of the amplification function of the sense amplifiers is halted, and a delay can be removed in the driving of write amplifiers in data bus amplifiers. In addition, these operations has no effect on the reading operation.

FIG. 2 is a diagram showing one part of a memory cell region MCR in the semiconductor storage device. When a column in a memory cell region which is not shown is selected, and a column in the memory cell region MCR shown in FIG. 2 is not selected, all the column selection signals CA0Z to CA3Z which are to be supplied to the latch enable generator 15 go to level L, and the deactivation of one of the latch enable signals of the sense amplifier does not occur.

In case of a memory where one of the sense amplifiers SA which are associated with the activated word line is always selected across the entire memory cell region MCR, since one of the column selection signals CA0Z to CA3Z necessary goes to level H, thus the latch enable generator 15 deactivates one of latch enable signals LEX/Z relative to all the sense amplifiers SA associated with the activated word line. As a result, the writing speed can be increased without the operation having any effect on the reading operation.

Figure 3:
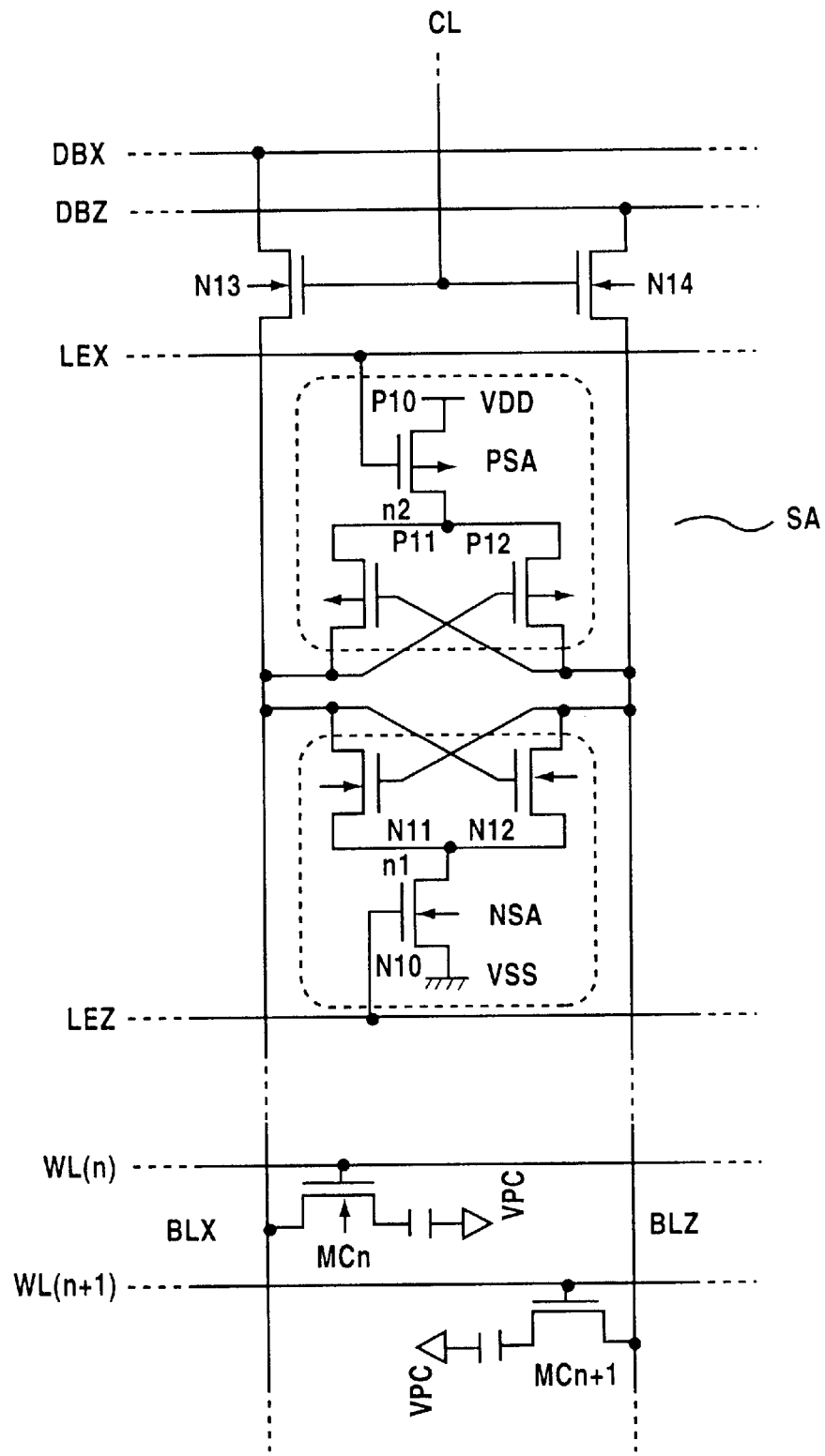
FIG. 3 is a detailed circuit diagram illustrating one part of a memory cell region MCR.

FIG. 3 is a detailed circuit diagram illustrating one part of the memory cell region MCR. In FIG. 3, memory cells $MC_n$ and $MC_{n+1}$ are provided at intersections of paired bit lines BLX and BLZ and word lines WL(n) and WL(n+1). The memory cells $MC_n$ and $MC_{n+1}$ are constituted by a selection transistor and a capacitor.

A sense amplifier SA is connected to the paired bit lines BLX and BLZ. The sense amplifier SA in FIG. 3 is the most commonly encountered circuit constituted by a CMOS circuit, and includes a first sense amplifier NSA for pulling one of the bit lines down to the ground level, and a second sense amplifier PSA for pulling the other bit line up to the power source level $V_{DD}$. The sense amplifiers NSA and PSA are activated upon the receipt of activation latch enable signals LEZ and LEX.

More specifically, the first sense amplifier NSA includes N type transistors N11 and N12, the source terminals of which are connected in common and the gates of which are connected to the bit lines BLZ and BLX, and an activation transistor N10 which pulls the common source terminal n2 down to the ground level $V_{SS}$. When the first latch enable signal LEZ is controlled to level H, the activation transistor N10 is rendered on and pulls the common source terminal n1 down to the ground level $V_{SS}$, and either the transistor N11 or N12, the gate of which is connected to either the bit line BLX or the bit line BLZ, which has a higher potential, is rendered on and pulls the bit line, which has a lower potential, down to the ground level.

The second sense amplifier PSA includes P type transistors P11 and P12, the source terminals of which are connected in common n2 and the gates of which are connected to the bit lines BLZ and BLX, and an activation transistor P10, which pulls the common source terminal n2 up to the power voltage level VDD. When the second latch enable signal LEX is controlled to level L, the activation transistor P10 is rendered on and pulls the common source terminal n2 up to the power voltage level $V_{DD}$, and either the transistor P11 or P12, the gate of which is connected to the bit line BLX or BLZ, which has a lower potential, is rendered on and pulls the bit line having a higher potential up to the power voltage level $V_{DD}$. The power voltage $V_{DD}$ may be either an external power voltage supplied to a chip or an internal power voltage generated in a chip by using an externally supplied power voltage.

As is described above, the sense amplifier SA which is constituted by a CMOS circuit includes the first sense amplifier NSA for pulling the bit line down to the ground level, and the second sense amplifier PSA for pulling the bit line up to the power voltage level $V_{DD}$. In order to detect a slight potential difference between the bit lines BLX and BLZ in the normal state, the sense amplifiers NSA and PSA are activated by the latch enable signals LEZ and LEX which respectively pull down and pull up the bit lines to the lower and the higher levels.

The paired bit lines BLZ and BLX of a selected column are connected to paired data bus lines DBZ and DBX via column gate transistors N13 and N14, which are rendered on in response to the column gate selection signal CL at level H. A clamping circuit, a read amplifier and a write amplifier, which will be described later, are connected to the data bus lines DBX and DBZ.

Figure 4:
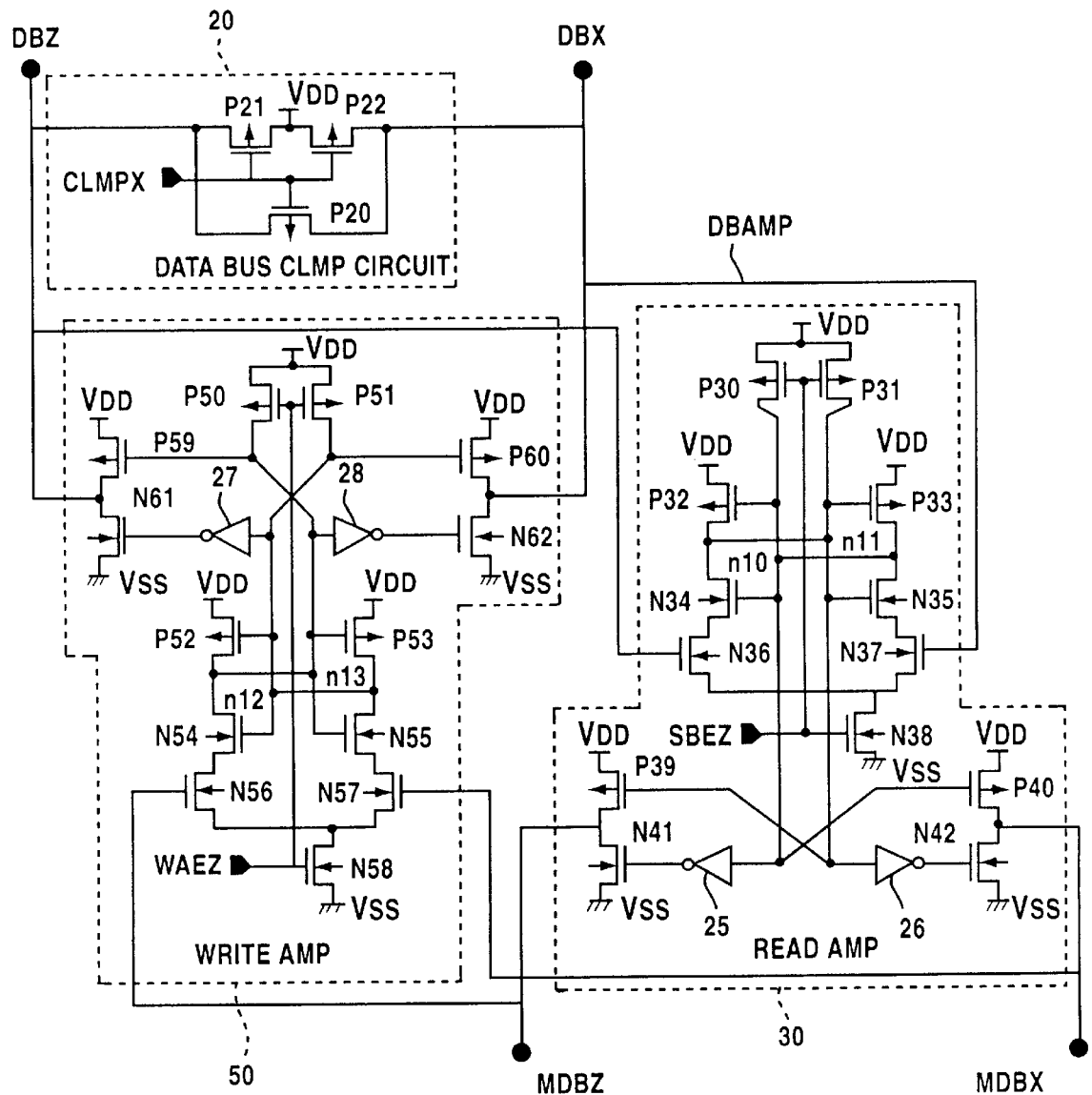
FIG. 4 is a detailed circuit diagram illustrating a clamping circuit, connected to a data bus, and a read amplifier and a write amplifier.

FIG. 4 is a detailed circuit diagram illustrating a clamping circuit, a read amplifier and a write amplifier which are connected to the data buses. A clamping circuit 20 clamps the levels of the data buses DBX and DBZ to either level H or level L, except when the data buses DBX and DBZ are driven into complimental phases each other. In the example in FIG. 4, the clamping circuit 20 incudes three P type transistors P20, P21 and P22. Upon the receipt of clamp control signal CLMPX at level L, the transistors P20 to P22 are simultaneously rendered conductive. The transistor P20 short-circuits the data busses DBX and DBZ to equalize them, and the pull-up transistors P21 and P22 drive the data buses DBX and DBZ up to the power voltage level $V_{DD}$. The clamping circuit 20 is deactivated when the data buses are driven during a reading or a writing process by the sense amplifier SA or a write amplifier 50 of a data bus amplifier DBAMP, while the clamping circuit 20 is activated when the driving of the data buses for writing or reading is completed.

A read amplifier 30 and a write amplifier to, provided for the data bus amplifier DBAMP, have the same circuit structure in the example of FIG. 4. The read amplifier 30 detects a potential difference between the data buses DBX/Z, and drives the main data bus MDBX/Z. The write amplifier 50 detects a potential difference which corresponds to write data supplied to the main data bus MDBX/Z, and drives the data bus DBX/Z.

The read amplifier 30 includes a reset circuit of P type transistors P30 and P31; a differential amplifier constituted by P type transistors P32 and P33 and N type transistors N34 to N38, for detecting the potential difference between the data buses DBX and DBZ; and a driver for driving one of the main data buses MDBX/Z in response to the output from the differential amplifier. This driver includes inverters 25 and 26, P type transistors P39 and P40 and N type transistors N41 and N42.

When the read amplifier 30 is deactivated, the activation signal SBEZ goes to level L, and both transistors P30 and P31 are conductive so that nodes n10 and n11 are at level H. This is the reset condition. When the column gate is opened and the read amplifier 30 is activated, the activation signal SBEZ goes to level H, the transistors P30 and P31 are rendered non-conductive, and the transistor N38 is rendered conductive. As a result, the differential amplifier constituted by the transistors N36 and N37 is activated for the detection of the potential difference between the data bus lines DBX/Z.

Assuming that the data bus line DBZ is at level H and the data bus line DBX is at level L, the transistor N36 is rendered conductive and pulls the node n11 down to level L. Since the node n11 goes to level L, the transistor N35 is rendered non-conductive and does not pull the node n10 down to low. The node n10 is maintained at level H. The transistors P32, P33, N34 and N35 constitute a latch circuit, which maintains the node n11 at level L and the node n10 at level H.

The driver is operated by the nodes n10 and n11 at level H and level L respectively, and the transistor P39 drives the main data bus DBZ up to level H while the transistor N42 pulls the main data bus MDBX down to level L.

When the activation signal SBEZ is returned to level L later, the P type transistors P30 and P31 are rendered conductive and the nodes n10 and n11 are pulled up to level H, which is for the reset condition.

The write amplifier 50 has the same circuit structure of the read amplifier 30, and performs the same processing. The write amplifier 50 includes a reset circuit of P type transistors P50 and P51; a differential amplifier constituted by P type transistors P52 and P53 and N type transistors N54 to N58, for detecting the potential difference between the main data buses MDBX and MDBZ; and a driver for driving the data bus DBX/Z in response to the output from the differential amplifier. This driver includes inverters 27 and 28, P type transistors P59 and P60, and N type transistors N61 and N62.

When the write amplifier 50 is deactivated, the activation signal WAEZ goes to level L and both transistors P50 and P51 are rendered conductive so that nodes n12 and n13 go to level H. This is the reset condition. When the write amplifier 50 is activated, the activation signal WAEZ goes to level H, the transistors P50 and P51 are rendered non-conductive, and the transistor N58 is rendered conductive. As a result, the differential amplifier constituted by the transistors N56 and N57 is activated and detects the potential difference between the main data bus lines MDBX/Z. The operation performed hereinafter is the same as that for the read amplifier 30.

When the memory cell is opened by driving the word lines, and the paired bit lines are driven respectively to level H and level L by the sense amplifier SA, the speed of the write operation performed by the write amplifier 50, in which inverted data are written to the memory cell via the column gate and the paired bit lines, is reduced because of the conflicting operations performed by the write amplifier 50 and the sense amplifier SA.

Figure 5:
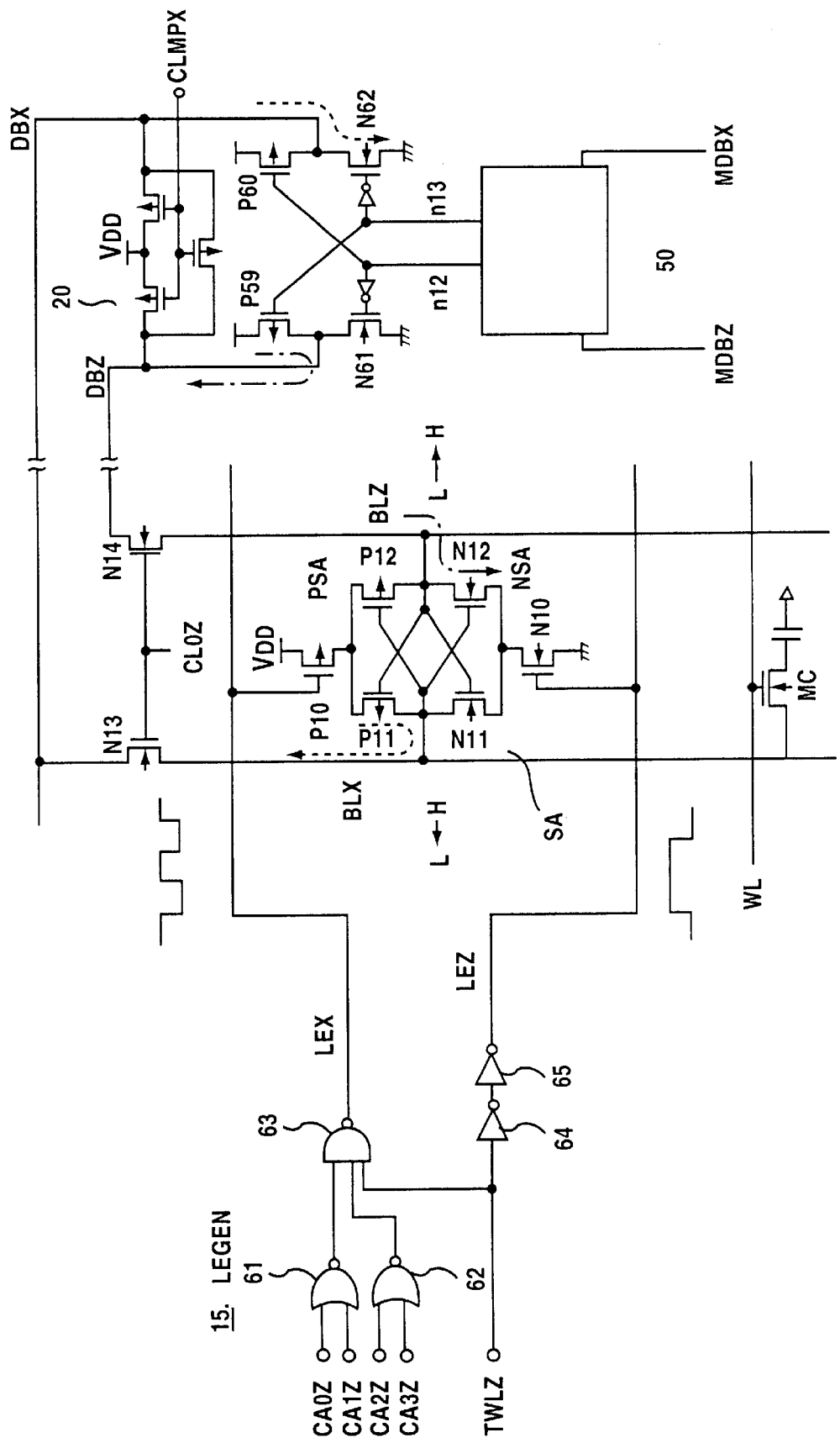
FIG. 5 is a circuit diagram illustrating a sense amplifier and a write amplifier according to the first embodiment of the present invention.

FIG. 5 is a circuit diagram showing the sense amplifier SA and the write amplifier 50 in this embodiment. The reason the write operation is delayed will now be explained while referring to FIG. 5. As is shown in FIG. 5, for the writing process, the sense amplifier SA and the write amplifier 50 are connected together via column gates N13 and N14 and the data buses DBX/Z. Assume that the level H is stored in the memory cell MC, and that the bit line BLX is pulled up to level H and the bit line BLZ is pulled down to level L by the activation of the sense amplifier SA. That is, the bit line BLX is driven by the transistor P11 of the sense amplifier SA and the bit line BLZ is driven by the transistor N12.

When the main data bus MDBX is pulled down to level L and the main data bus MDBZ is pulled up to level H, the write amplifier 50 drives the node n12 up to level H and pulls the node n13 down to level L, and pulls the data bus line DBX down to the level L and drives the data bit line DBZ up to level H. At this time, as is indicated by the broken line, a through current flows from the transistor P11 of the sense amplifier SA to a transistor N62 of the write amplifier 50, and the bit line BLX is forcibly pulled down to level L by the large driving capability of the transistor N62 of the write amplifier 50. Similarly, as is indicated by the chained line, a through current flows from the transistor P59 of the write amplifier 50 to the transistor N12 of the sense amplifier SA, and the bit line BLZ is forcibly driven up to level H by the large driving capability of the transistor P59 of the write amplifier 50.

As is described above, when the bit line is driven invertedly by the write amplifier 50, the sense amplifier SA connected to the bit lines must be inverted. Such a driving operation causes the writing speed to be reduced, and the through current yields an increase of the power consumption.

In this embodiment, therefore, after the sense amplifier SA is activated, either activation signal LEX/Z, of the sense amplifier SA, is changed to the deactivation level at the time the column gate is opened. As a result, either the circuit PSA for pulling up to level H, or the circuit NSA for pulling down to level L, of the sense amplifier SA is deactivated. Therefore, at least one of the conflicts arising from the operation of the transistors, indicated by the broken line or the chained line, can be avoided and the writing operation can be performed at a high speed. In addition, this process does not adversely affect the reading operation. Since the above process is performed in the same manner for reading and for writing, it is not necessary to differently control the sense amplifier SA for the reading and the writing operations.

Which activation signal LEX/Z of the sense amplifier SA is to be activated is determined by whether the data bus clamping circuit performs clamping at level L or at level H. When the data bus clamping circuit clamps the data bus at level H, as is shown in FIGS. 4 and 5, the activation signal LEX of the sense amplifier SA is deactivated so that the second sense amplifier PSA for driving the bit line and data bus up to level H is deactivated. When the data clamping circuit clamps the data bus at level L, the activation signal LEZ of the sense amplifier SA is deactivated so that the first sense amplifier NSA for pulling the bit line and data bus down to level L is deactivated.

Since the data bus clamping circuit 20 in the embodiment in FIG. 5 is a level H clamping type, the latch enable signal LEX, which is the activation signal, is temporarily deactivated at level H at a timing at which the column gate selection signal CL0Z goes to level H after the sense amplifier SA is activated, so that the sense amplifier PSA is deactivated. In FIG. 5 is shown the latch enable generator 15 for performing the above process. The latch enable generator 15 receives the column selection signals CA0Z to CA3Z, for a column to which the word line WL belongs, and a timing signal TWLZ. In addition, the latch enable generator 15 includes NOR gates 61 and 62, a NAND gate 63, and inverters 64 and 65.

Figure 6:
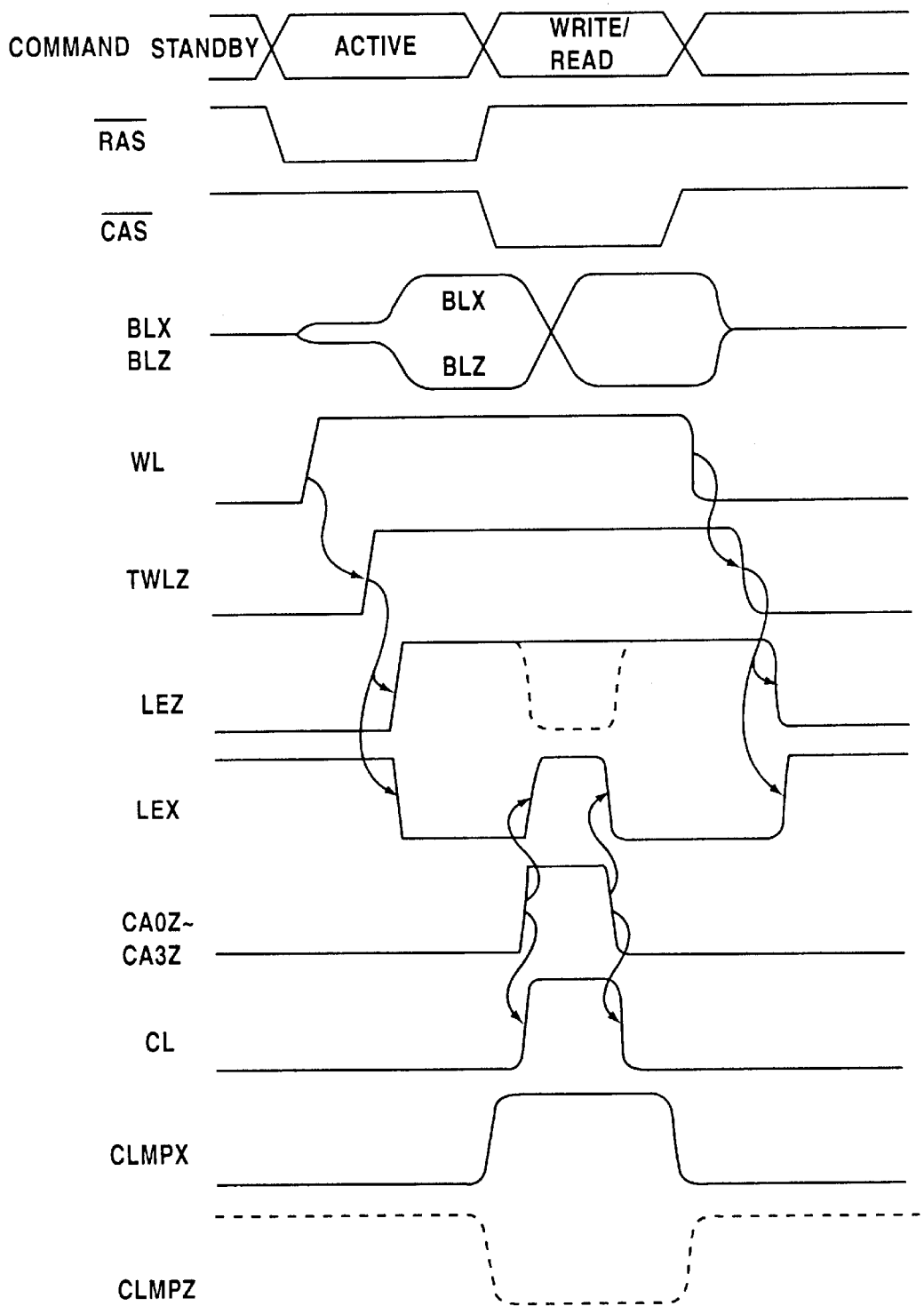
FIG. 6 is a signal waveform diagram showing the processing performed in FIG. 5.

FIG. 6 is a signal waveform diagram showing the operation in FIG. 5. In the standby state, the paired data bus lines DBX/Z not shown in FIG. 5 are maintained at level H by the clamping circuit 20. In the active state, when a command supplied in synchronization with a low address strobe signal /RAS is active, a word line WL selected by row addresses which are also supplied at the same time, rises. As a result, the transistors in the memory cell MC are rendered conductive and a minute voltage difference is produced between the paired bit lines BLX and BLZ. Presume then that the bit line BLX is at a higher potential level.

At the leading edge of the timing signal TWLZ produced when a predetermined time has elapsed following the rising of the word line WL, the latch enable generator 15 drives the activation signals LEZ and LEX up to level H and down to level L, respectively. Then, the activated transistors N10 and P10 of the sense amplifier SA are rendered conductive, the voltage difference of the bit line pair is detected, and the bit line BLX is driven up to level H by the transistor P11 of the sense amplifier PSA for level H, while the bit line BLZ is pulled down to level L by the transistor N12 of the sense amplifier NSA for level L.

After the sense amplifier SA has satisfactorily driven the bit lines BLX and BLZ, a column address is supplied in synchronization with a column address strobe signal /CAS. Also, a write command or a read command is supplied. One of the column selection signals CA0Z to CA3Z generated from the column address signal rises to level H, and in response to this, one of the column gate selection signals CL0Z to CL3Z is raised by the column decoder driver 3, so that the column gate between the bit line pair and the data bus line pair is opened.

In this embodiment, the activated state of the activation signal LEX of the sense amplifier SA is released at the timing when the column gate is open. Specifically, the activation signal LEX shown in FIG. 5 is driven up to level H by the NAND gate 63.

For reading processing, the sense amplifier SA drives the data bus lines DBX/Z. More specifically, the data bus line DBZ in FIG. 4 is lowered from level H to level L. Then, the read amplifier 30 of the data bus amplifier DBAMP is activated, the potential difference for the data bus lines DBX/Z is detected, and the main data bus lines MDBX/Z are driven further. At this time, even when the activated state of the activation signal LEX of the sense amplifier SA is released, the activated state of the signal LEZ of the sense amplifier NSA, which pulls down to level L the data bus line BLZ in the H-level clamped state, is not released, so that the operation of the sense amplifier SA for driving the data bus lines during the reading process is not adversely affected.

For the writing operation, the write amplifier 50 in FIG. 5 is activated. Presuming that a voltage at level L is supplied to the main data bus line DBX and a voltage at level H is supplied to the main data bus line MDBZ, the write amplifier 50 drives the data bus line DBX down to level L and the data bus line DBZ up to level H. However, since the sense amplifier PSA of the sense amplifier SA, which drives the bit line up to level H, is in the deactivated state when the column gates N13, N14 are open, and the transistor P11 is non-conductive, therefore no conflict occurs between the operations of the transistor N62 of the write amplifier 50 and of the transistor P11 of the sense amplifier SA. As a result, the driving of the data bus line DBX and the bit line BLX down to level L is performed at a high speed. Thereafter, the bit line BLX is rapidly pulled down to level L and renders the transistor N12 non-conductive, so that there is a reduction in the occurrence of conflict between the operation of the transistor P59 of the write amplifier 50 and the transistor N12 of the sense amplifier SA.

The activation signal LEX/Z of the sense amplifier SA which has been deactivated is driven again to the activation level as shown in FIG. 6, and the sense amplifier SA can initiate the writing to the memory cell.

As is described above, when the data bus line DBX/Z is clamped at level H, the H-level side circuit PAS of the sense amplifier SA is deactivated at a timing at which the column gate is opened, so that the writing operation can be performed at a high speed without the reading operation being adversely affected. In addition, since different control methods for the sense amplifier SA are not required for the reading and the writing, a simplified structure can be provided for the controller 15.

Figure 7:
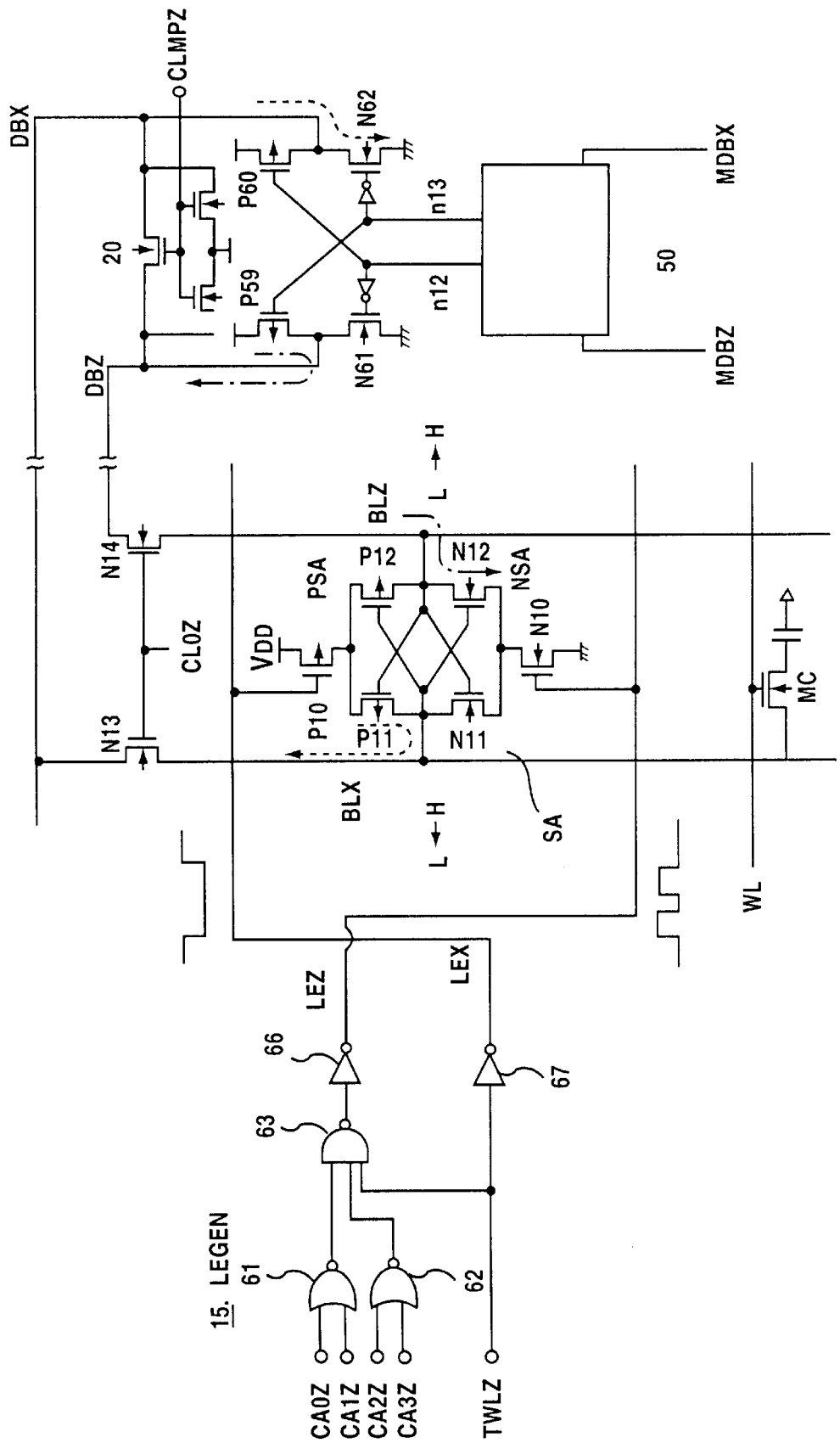
FIG. 7 is a diagram illustrating a latch enable generator when a data bus line clamping circuit performs clamping at level L.

FIG. 7 is a circuit diagram showing a latch enable generator 15 when the data bus line clamping circuit 20 performs L-level clamping. The latch enable signal LEZ for this circuit is depicted by the broken line in FIG. 6. Specifically, the clamping circuit 20 pulls the data bus line DBX/Z down to level L in response to raising of the clamping signal CLMPZ. At a timing at which the column gate selection signal CL rises and the column gate N13, N14 is opened, the latch enable generator 15 deactivates the activation signal LEZ and pulls it down to level L, and releases the activated state of the circuit NSA, of the sense amplifier SA, which pulls the bit line down to level L. As a result, the conductive state of the transistor N12 is eliminated, and the conflicts arising from the operation of the transistors P59 of the write amplifier 50 and the transistor N12 are avoided. The other processing is the same as that explained while referring to FIGS. 5 and 6.

As is described above, since the active state of the circuit PSA of the sense amplifier SA that drives to level H or the circuit NSA that pulls down to level L is temporarily released in accordance with the clamp level on the data bus line DBX/Z, the speed of the writing operation can be increased without the reading operation being affected, and the amount of through current wastefully consumed by the conflicting operations of the transistors during the writing operation can be reduced.

[Second Embodiment]

In the first embodiment, one of the activation signals (latch enable signals) LEX/Z of the sense amplifiers are brought to the deactivation level in synchronization with the time at which the column gate is opened. However, since the latch enable generator 15 must drive the activation signals LEX/Z, which are connected to a plurality of sense amplifiers SA, it will be difficult to drive the activation signal fast if a large capacitive load is imposed on the activation signal line. The driving of the activation signal of the sense amplifier SA must be performed only for a sense amplifier SA connected to bit lines for which the column gate has been opened, and the driving of activation signals for unrelated sense amplifiers SA will result in a current waste. In the second embodiment, therefore, a memory cell region is divided into segments for the transmission of an activation signal for a sense amplifier SA which is temporarily deactivated, and a latch enable decoder for driving the activation signal is provided for each segment.

Figure 8B:
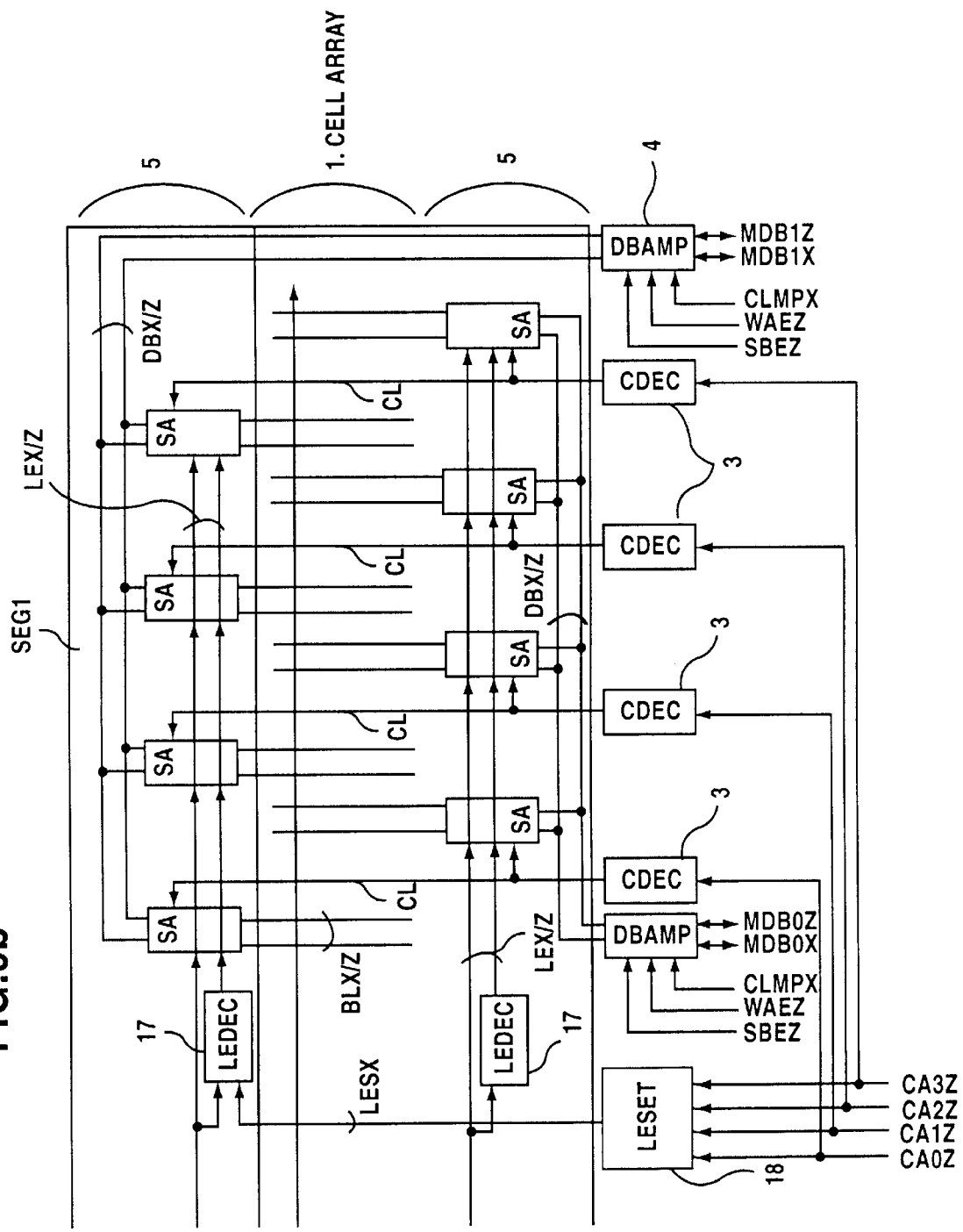
FIG. 8 is a diagram illustrating the general arrangement of a semiconductor storage device according to a second embodiment of the present invention.

FIG. 8 is a overall circuit diagram according to the second embodiment. In this embodiment, a memory cell region MCR is divided into left and right segments SEG0 and SEG1, and a latch enable decoder 17 for driving an activation signal for a sense amplifier SA is provided for each segment. Latch enable generators 16 are controlled by a timing signal TWLZ generated when a predetermined time has elapsed since the rising edge of the word line WL, and generate activation signals LEX/Z. The activation signals, which are to be driven at a timing at which the column gate is opened, are generated for individual segments SEG0, SEG1 by the latch enable decoders 17.

A latch enable setting circuit 18 is provided for each segment, and generates a latch enable set signal LESX for permitting the driving of one of the activation signals LEX/Z in case where a column gate belonging to the corresponding segment is selected. In the example in FIG. 8, the same column selection signals CA0Z and CA3Z are supplied to the latch enable set circuits 18 provided for the segments SEG0 and SEG1. However, only a set of column selection signals which are to be supplied to a selected segment are at a level for the selected state. This control is exercised by a segment select signal (not shown). Therefore, in case where, for example, the column gate in the segment SEG0 is selected, the column select signals CA0Z to CA3Z at level H are supplied only to the latch enable set circuit 18 of the segment SEG0. And only the activation signals (latch enable signals) LEX/Z of the segment SEG0 are driven.

In the embodiment in FIG. 8, a data bus amplifier 4 is connected to data buses DBX/Z. The arrays of sense amplifiers SA in the lower portion in FIG. 8 are connected via the respective data bus amplifiers 4 to main data buses MDB0X/Z, while the arrays of sense amplifiers SA in the upper portion are connected via the data bus amplifiers 4 to main data buses MDBlX/Z. Column decoder drivers 3 simultaneously supply column gate select signals CL to the upper and the lower sense amplifier SA arrays. Therefore, one sense amplifier SA from each of the upper and lower sense amplifier SA arrays is connected across the data bus lines DBX/Z to the corresponding data bus amplifier 4.

Figure 9:
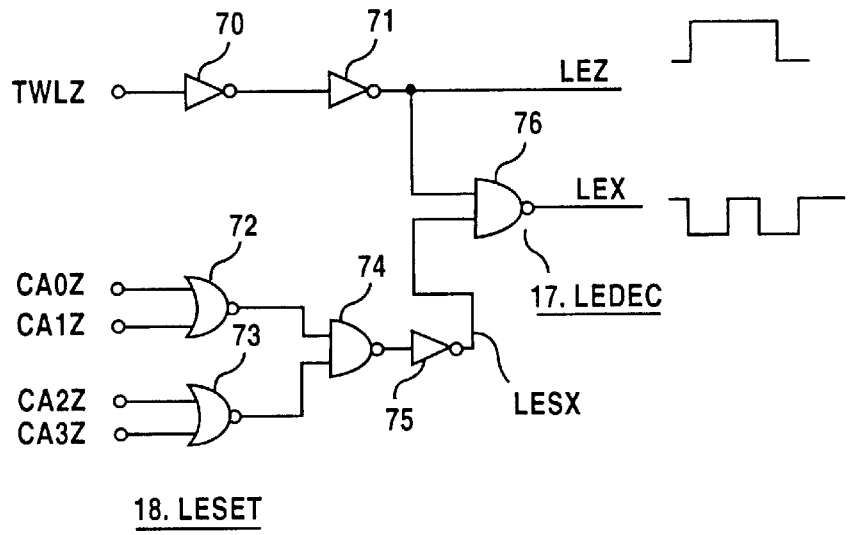
FIG. 9 is a diagram illustrating one arrangement for a latch enable generator, a latch enable setting circuit and a latch enable decoder.

FIG. 9 is a diagram illustrating the arrangements of a latch enable generator LEGEN, a latch enable set circuit LESET and a latch enable decoder LEDEC. In this example, a level-H clamping circuit is provided for the data bus line. The latch enable generator 16 (LEGEN), to which a timing signal TWLZ is supplied, generates the activation signal LEZ by using inverters 70 and 17. The latch enable set circuit 18 (LESET) is constituted by NOR gates 72 and 73, a NAND gate 74 and an inverter 75, and drives a latch enable set signal LESX to level L when one of the column selection signals CA0Z to CA3Z goes to level H. In response to the signal LESX, the latch enable decoder 17 temporarily drives the activation signal LEX up to the deactivated state (level H).

Figure 10:
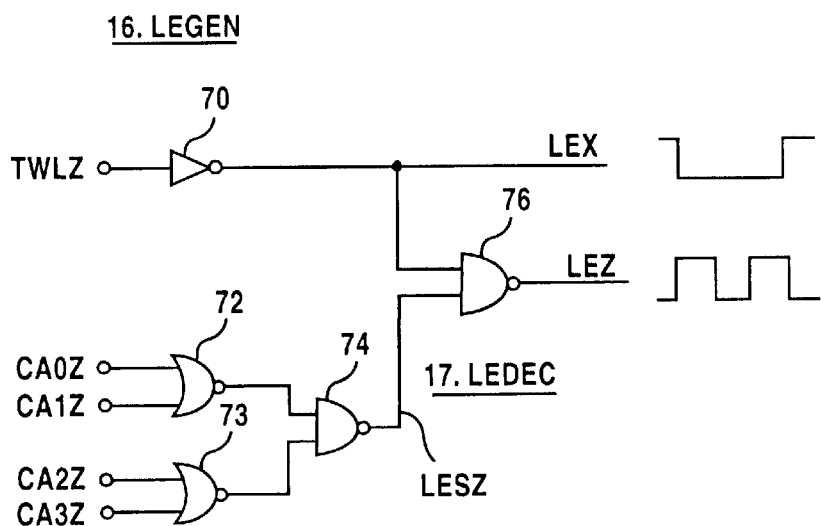
FIG. 10 is a diagram illustrating another arrangement for the latch enable generator, the latch enable setting circuit and the latch enable decoder.

FIG. 10 is a diagram illustrating another arrangement for the latch enable generator LEGEN, the latch enable set circuit LESET and the latch enable decoder LEDEC. In this example, a level-L clamping circuit is provided for the data bus lines. The latch enable generator 16 (LEGEN), to which a timing signal TWLZ is supplied, drives the activation signal LEX to level L by using an inverter 70. The latch enable set circuit 18 (LESET) is constituted by NOR gates 72 and 73 and a NAND gate 74, and generates a latch enable set signal LESZ with level H when one of the column selection signals CA0Z to CA3Z goes to level H. In response to the signal LESZ, the latch enable decoder 17 temporarily pulls the activation signal LEZ down to the deactivated state (level L) by using a NAND gate 76.

In the second embodiment, one of the activation signals of the sense amplifier SA is temporarily driven up or down to the deactivation level for each segment at a timing at which a column gate is opened. Therefore, only the activation signal for a necessary segment must be driven so that the drive load is small. As a result, the semiconductor storage device can be operated at a high speed while consuming less power.

[Third Embodiment]

In the second embodiment, a latch enable decoder LEDEC is provided for individual segments obtained by dividing the memory cell region in the column direction or the word line direction. In the third embodiment, however, a latch enable decoder LEDEC, for driving one of the activation signals LEX/Z for each selected segment, is provided for individual blocks obtained by dividing a memory cell in the direction of rows or bit line direction. The latch enable decoder LEDEC employs a column gate select signal for a block selected by a block decoder, and drives either activation signal LEX/Z, for a sense amplifier SA in the selected block, to the deactivated state.

Figure 11A:
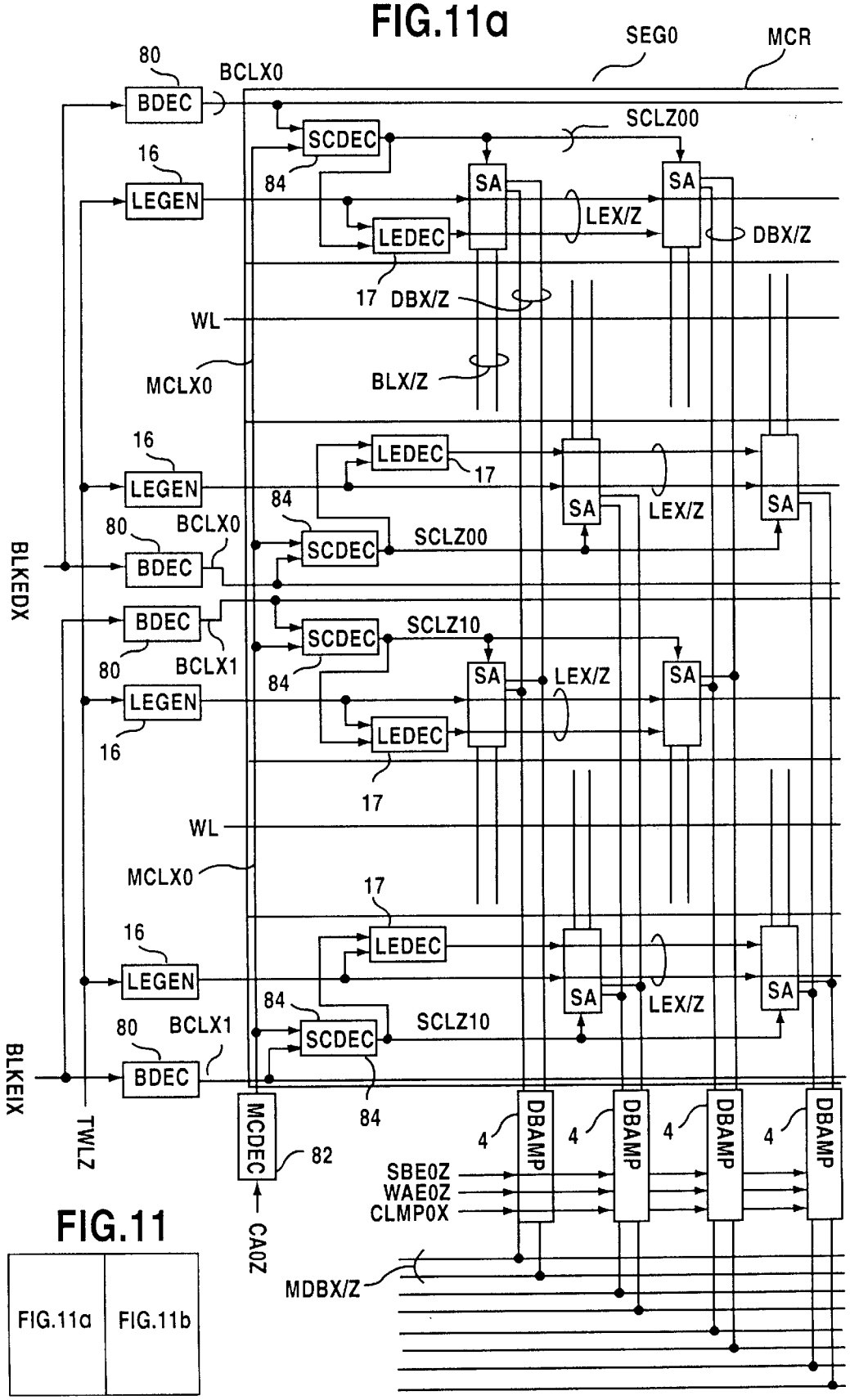
FIG. 11 is a diagram illustrating the general arrangement of a semiconductor storage device according to a third embodiment of the present invention.
Figure 11:
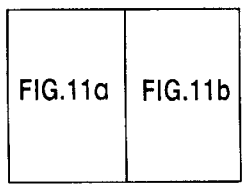
Figure 11B:
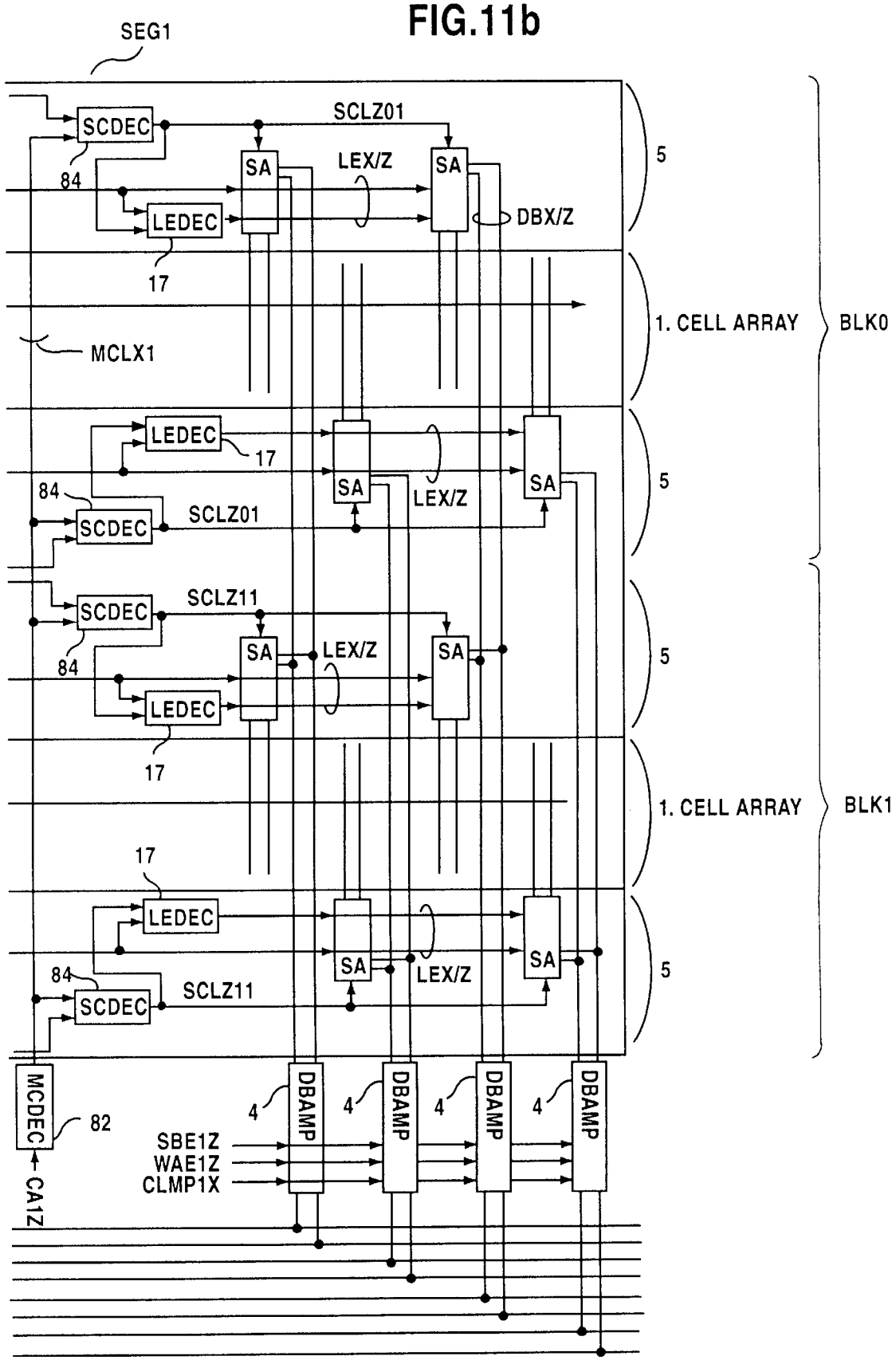

FIG. 11 is a diagram illustrating in its entirety the arrangement of a semiconductor storage device according to the third embodiment. In this embodiment, a memory cell MCR is divided into left and right segments SEG0 and SEG1, and is also divided into upper and lower blocks BLK0 and BLK1. Four bit line pairs in the segment are connected to four data bus pairs DBX/Z, which are respectively connected via data bus amplifiers 4 to four main data bus MDBX/Z pairs. Thus, the semiconductor storage device has four bits output.

Either the block BLK0 or the block BLK1 is selected by a block decoder 80. Thereafter, the selected block decoder 80 receives either a block select signal BLKE0X or a block selected signal BLKE1X, which is generated at a low address, and produces a block column gate select signal BCLX0 or a block column gate select signal BCLX1. Then, either the segment SEG0 or the segment SEG1 is selected by a main column decoder 82, and the main column decoder 82 either receives a column select signal CA0Z or a column select signal CA1Z, and generates either a main column gate select signal MCLX0 or a main column gate select signal MCLX1.

Sub-column decoders 84 receive the block column gate select signal BCLX and the main column gate select signal MCLX, and generate sub-column select signals SCLZ00 to SCLZ11 for the four bit line pairs in a selected segment in a selected block.

The feature of this embodiment is that the sub-column gate select signals SCLZ, which are generated by the block decoders 80 (BDEC), the main column decoders 82 (MCDEC), and the sub-column decoders 84 (SCDEC), are employed to temporarily drive one of the activation signals LEX/Z for a necessary sense amplifier SA to a deactivation level. To do so, the sub-column gate select signal SCLZ is employed at the latch enable decoder 17 to temporarily drive, to the deactivated state, one of the activation signals LEX/Z which is generated by the latch enable generator 16. In the example in FIG. 11, at a timing when the column gate is opened, one of the activation signals LEX/Z is temporarily deactivated for the sense amplifier SA connected to a bit line pair in a quarter region of the cell array.

Figure 12:
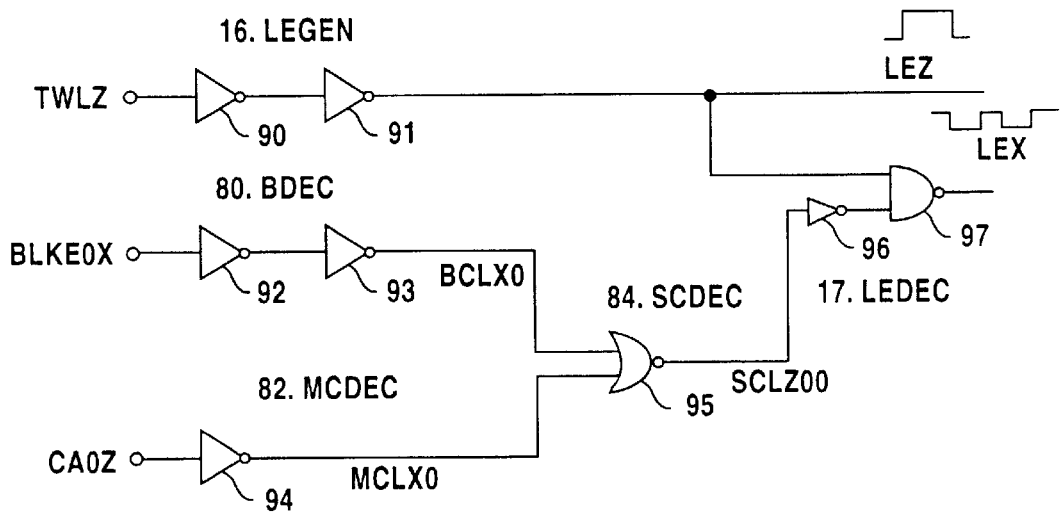
FIG. 12 is a circuit diagram showing one arrangement for a latch enable generator and a block decoder.

FIG. 12 is a circuit diagram illustrating an example arrangement for the latch enable generator LEGEN, the block decoder BDEC etc. In the example in FIG. 12, a clamping circuit along a data bus clamps the data bus at level H. Of the activation signals of the sense amplifier SA, a signal LEX for activating the circuit PSA, which drives the bit line up to level H, is temporarily driven to the deactivated state.

The latch enable generator 16, which is constituted by inverters 90 and 91, receives a timing signal TWLZ and generates an activation signal LEZ. The block decoder 80, which is constituted by inverters 92 and 93, receives a block select signal BLK0X and generates a block column gate select signal BCLX0.

The main column decoder 82, which is constituted by an inverter 94, receives a column select signal CA0Z and generates a main column gate select signal MCLX0. The sub-column decoder 84, which is constituted by a NOR gate 95, receives a block column gate select signal BCLX0 and a main column gate select signal MCLX0, and generates a sub-column gate select signal SCLZ00 which goes to level H when the two signals are in the selected state, i.e., at level L. In addition, the latch enable decoder 17, which is constituted by an inverter 96 and an NAND gate 97, receives an activation signal LEZ and a sub-column gate select signal SCLZ00, and temporarily drives the activation signal LEX up to the deactivated state, i.e., to level H, at a timing at which the column gate is opened.

Figure 13:
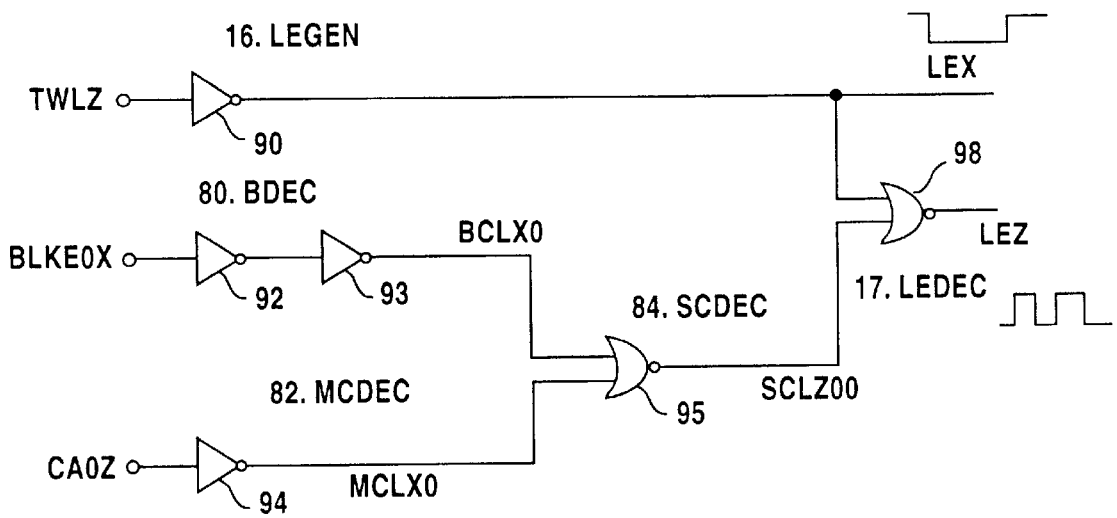
FIG. 13 is a circuit diagram showing another arrangement for the latch enable generator and the block decoder.

FIG. 13 is a circuit diagram illustrating another arrangement for the latch enable generator LEGEN, the block decoder BDEC, etc. In the example in FIG. 13, the clamping circuit along the data bus clamps the data bus at level L. Of the activation signals for the sense amplifier SA, a signal LEZ for activating the circuit NSA, which pulls the bit line down to level L, is temporarily driven to the deactivated state, i.e. level L.

The latch enable generator 16, which is constituted by an inverter 90, receives a timing signal TWLZ and generates an activation signal LEX. The block decoder 80, the main column decoder 82 and the sub-column decoder 84 have the same structures as are shown in FIG. 12. Furthermore, the latch enable decoder 17, which is constituted by a NOR gate 98, receives an activation signal LEX and a sub-column gate select signal SCLZ00 and temporarily drives the activation signal LEZ down to the deactivated state, i.e., to level L, at a timing at which the column gate is opened.

As is described above, according to the present invention, when each of the sense amplifiers SA connected to the bit line pairs is constituted by a sense amplifier PSA, for driving the bit line up to level H, and a sense amplifier NSA, for pulling the bit line down to level L, one of the sense amplifiers PSA and NSA is deactivated at a timing at which the column gate is opened, so that the speed of the writing operation can be increased without the reading operation being affected. Therefore, the operation of the sense amplifiers SA can be performed in the same manner for reading and for writing, and the writing speed can be increased.

In addition, the activation signal is temporarily deactivated to deactivate one sense amplifier, and the driving of the activation signal is performed for each of the segments obtained by dividing a memory cell region in the column direction, or the driving of the activation signal is performed for each of blocks obtained by dividing the memory cell region in the direction of rows. Therefore, since only the activation signal only for a necessary sense amplifier is driven to the deactivated state, driving at a higher speed is possible and wasteful current consumption can be prevented.

What is claimed is:

1. A semiconductor storage device comprising:
    a plurality of bit line pairs;
    a plurality of word lines intersecting said bit line pairs;
    a plurality of memory cells arranged at intersections of said bit line pairs and said word lines;
    sense amplifiers connected to said bit line pairs, each of which includes a first sense amplification circuit for driving one bit line of said bit line pairs to a first level, and a second sense amplification circuit for driving the other bit line to a second level higher than said first level;
    column gates respectively provided for said bit line pairs;
    a data bus line pair connected via said column gates to a selected bit line pair;
    data bus amplifier connected to said data bus line pair, which includes a read amplifier for detecting a level of said data bus line pair and a write amplifier for driving said data bus line pair; and
    a sense amplifier controller for deactivating, at a timing when said column gates are opened, either said first or said second sense amplification circuit of said sense amplifier.

2. A semiconductor storage device according to claim 1, wherein said sense amplifier controller supplies, to said sense amplifiers, a first and a second activation signal for activating said first and said second sense amplification circuits, and drives either said first or said second activation signal to a deactivation level at a timing said column gate is opened.

3. A semiconductor storage device according to claim 1 or 2, further comprising a clamping circuit, which is connected to said data bus line pair and which drives said data bus line pair to level H at a time other than during a period in which said column gates are open, wherein said sense amplifier controller deactivates said second sense amplification circuit at a timing said column gate is opened.

4. A semiconductor storage device according to claim 1 or 2, further comprising a clamping circuit, which is connected to said data bus line pair and which drives said data bus line pair to level L at a time other than during a period in which said column gates are open, and wherein said sense amplifier controller deactivates said first sense amplification circuit at a timing said column gate is opened.

5. A semiconductor storage device according to claim 1 or 2, wherein said sense amplifier controller activates said first and said second sense amplification circuits of said sense amplifier, then deactivates either said first or said second sense amplification circuit at a timing said column gate is opened, and thereafter activates either said first or said second sense amplification circuit which has been deactivated.

6. A semiconductor storage device comprising:
    a plurality of bit line pairs;
    a plurality of word lines intersecting said bit line pairs;
    a plurality of memory cells arranged at intersections of said bit line pairs and said word lines;
    sense amplifiers connected to said bit line pairs, each of which includes a first sense amplification circuit for driving one bit line of said bit line pairs to a first level, and a second sense amplification circuit for driving the other bit line to a second level higher than said first level;
    column gates respectively provided for said bit line pairs;
    a data bus line pair connected via said column gates to a selected bit line pair;
    data bus amplifier connected to said data bus line pair, which includes a read amplifier for detecting a level of said data bus line pair and a write amplifier for driving said data bus line pair; and
    a sense amplifier controller for supplying, to said sense amplifiers, a first and a second activation signal for activating said first and said second sense amplification circuits, and for driving either said first or said second activation signal to a deactivation level at a timing said column gate is opened,
    wherein a process for driving either said first or said second activation signal to a deactivation level is performed for each of segments which are so defined in a direction of said word lines that a predetermined number of sense amplifiers are included therein.

7. A semiconductor storage device comprising:
    a plurality of memory blocks, each including,
        a plurality of bit line pairs,
        a plurality of word lines intersecting said bit line pairs,
        a plurality of memory cells arranged at intersections of said bit line pairs and said word lines,
        sense amplifiers connected to said bit line pairs, each of which includes a first sense amplification circuit for driving one bit line of said bit line pairs to a first level, and a second sense amplification circuit for driving the other bit line to a second level higher than said first level, and column gates respectively provided for said bit line pairs;

a data bus line pair connected via said column gates to a selected bit line pair;

data bus amplifier connected to said data bus line pair, which includes a read amplifier for detecting a level of said data bus line pair and a write amplifier for driving said data bus line pair; and a sense amplifier controller for supplying, to said sense amplifiers, a first and a second activation signal for activating said first and said second sense amplification circuits, and for driving either said first or said second activation signal to a deactivation level at a timing said column gate is opened, wherein said sense amplifier controller drives said first or second activation signal to second deactivation level for a selected memory block.

8. A semiconductor storage device comprising:

a sense amplifier, coupled to memory cells via bit line pairs, having a pair of input/output nodes, each of which includes a first sense amplification circuit for driving one bit line of said bit line pairs to a first level, and a second sense amplification circuit for driving the other bit line to a second level higher than said first level;

a data bus line pair;

column gates respectively provided between said data bus line pair and said pair of input/output nodes; and a sense amplifier controller for deactivating, at a timing when said column gates are opened, either said first or said second sense amplification circuit of said sense amplifier.

* * * * *